United States Patent [19]

Jälgle

[11] 4,366,345

[45] Dec. 28, 1982

[54] ELECTROMECHANICAL COMPONENT SEALING SYSTEM

[75] Inventor: Bruno Jälgle, Petershausen, Fed. Rep. of Germany

[73] Assignee: Siemens Aktiengesellschaft, Berlin & Munich, Fed. Rep. of Germany

[21] Appl. No.: 33,733

[22] Filed: Apr. 26, 1979

[30] Foreign Application Priority Data

Jul. 18, 1978 [DE] Fed. Rep. of Germany ....... 7821508

[51] Int. Cl.3 .............................................. H05K 5/06

[52] U.S. Cl. .............................. 174/52 S; 174/52 PE; 264/261

[58] Field of Search ............. 174/52 S, 52 PE, 52 FP; 249/110, 119, 123; 264/261, 262, 263; 425/447

[56] References Cited

U.S. PATENT DOCUMENTS 2,672,653 3/1954 Simpkins et al. ............... 249/110 X
2,733,479 2/1956 English ........................... 249/110 X
3,331,912 7/1967 Stricker et al. ............. 174/52 FP X
4,126,292 11/1978 Saeki et al. .......................... 249/110
4,246,437 1/1981 Frey et al. ...................... 174/52 PE

FOREIGN PATENT DOCUMENTS 2504021 2/1977 Fed. Rep. of Germany .
2616299 9/1977 Fed. Rep. of Germany .
7735936 3/1978 Fed. Rep. of Germany .

*Primary Examiner*—B. A. Reynolds
*Assistant Examiner*—D. A. Tone
*Attorney, Agent, or Firm*—Hill, Van Santen, Steadman, Chiara & Simpson

[57] ABSTRACT

A channel system is provided in the base plate of an electromechanical component. Casting resin is conveyed from relatively wide feed channels to connecting pins of the component via narrower capillary channels in order to dependably seal the apertures for the connecting pins in the base plate.

6 Claims, 3 Drawing Figures

ELECTROMECHANICAL COMPONENT SEALING SYSTEM

BACKGROUND OF THE INVENTION

The invention relates to an electromechanical component, in particular a relay, having a housing in which apertures or punctures provided for connection pins in the base plate are sealed with casting resin.

In components of this type it is already known to let the housing cover protrude over the edge of the base plate and to fill the total space between the protruding edges with casting resin. In order to securely seal all connection pins with this method, a relatively thick casting resin layer must be applied; i.e., the total height of the component is increased and a large amount of casting resin is used.

If one wishes to limit the amount of casting resin, the problem arises of properly distributing this casting resin on the surface of the base plate and primarily at the points to be sealed, namely, to bring it to the punctures or apertures for the connection pins in a sufficient amount. The casting resin also should not be too thin, otherwise it will flow through the punctures into the interior of the component in an undesirable manner. In order to resolve this problem, it has been suggested to mount a fleece with a high capillary absorbancy to the base plate in order to distribute the casting resin (U.S. patent application Ser. No. 783,838 filed Apr. 1, 1977). However, this fleece is an additional component which must be placed in a separate process. Additionally, it has been suggested to use a protective trough consisting of a shrinkable synthetic material (German Auslegeschrift No. 2,504,021 corresponding to British Pat. No. 1,490,951). The interior surface of the protective trough utilized there is coated with a synthetic material adhesive which liquefies during the shrinking-on process and which hardens or cures during the cooling process. There too, an additional component, namely, the specially produced and mounted shrinking trough is necessary.

SUMMARY OF THE INVENTION

It is an object of the invention to design an electromechanical component of the initially mentioned type such that the casting resin is conveyed to the ducts to be sealed without additional components; the component height is not to be increased; and the amount of casting resin utilized is to be minimized.

This objective is achieved in that a channel system is provided on the exterior surface of the base plate in order to accommodate the casting resin, whereby from relatively wide filling channels considerably narrower capillary channels lead to the punctures or holes for the connection pins.

Thus, this channel system consists of channels of two different widths. Channels for feeding the casting resin are used which—by means of their width—facilitate a proper filling with the aid of filling jets. However, narrow capillary channels branch off from these feeding channels which lead to and around the connecting pins and which, by their capillary effect, convey the casting resin precisely to the point to be sealed, namely, to the punctures or apertures of the base plate. Therefore, the casting resin is brought to the desired location without having to bring the feeding jets too closely to the connection pins, so that the pins are not contaminated with casting resin.

In a further development of the invention the base surfaces of the feeding channels can have an incline towards the capillary channels. The flow behavior towards the desired direction is thereby improved. Additionally, the channel system can have a circumcirculating channel in the area of the edge gap between the base plate and a protective cover of the component. There, also, the channel can have an incline towards the edge gap.

DESCRIPTION OF THE PREFERRED EMBODIMENTS

Figure 1:
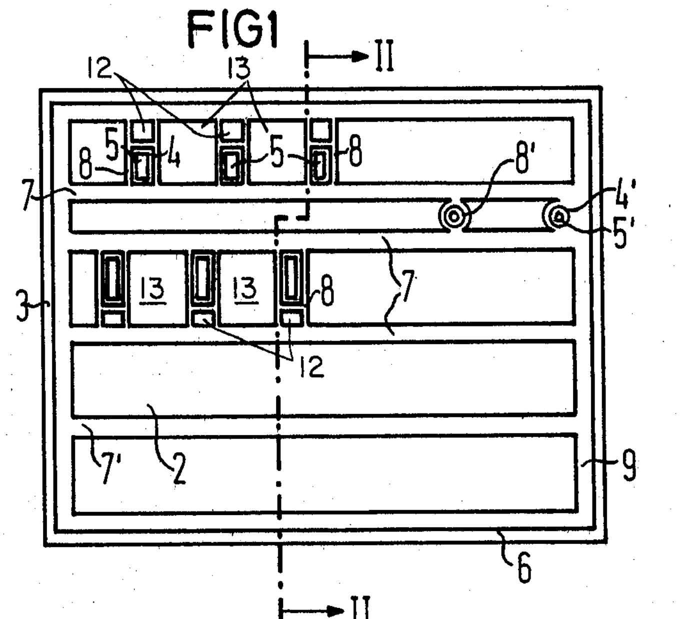
FIG. 1 shows by a plan view a connecting side of a component in accordance with a design of the invention.
Figure 2:
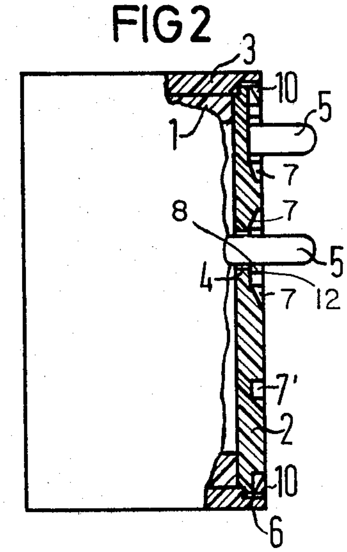
FIG. 2 shows a cross-sectional view taken along line II—II of FIG. 1.

The component illustrated in FIGS. 1 and 2, for example, a relay, has a base member 1 with a base plate 2 and a protective cover 3. Apertures or punctures 4 for connecting pins 5 are provided in the base plate 2. In addition to the flat connecting pins 5, round connecting pins 5' can also pass through correspondingly round apertures 4'. These ducts 4 or 4', and also edge gap 6 between base plate 2 and protective cover 3, are to be sealed with casting resin.

Base plate 2 has a channel system with longitudinally proceeding feed channels 7 for feeding the casting resin, and has crosswise proceeding capillary channels 8 adjacent higher portions 13 and 12 of the base plate 2 which lead from the feed channels to the apertures 4 or 4'. The casting resin is brought into the feed channels 7 via jets and flows from there to apertures 4 or 4' on the basis of the capillary effect of channels 8, whereby connecting pins 5 or 5' are flowed around and sealed. An oblique design of the channel base in feed channels 7 facilitates the flow of the casting resin towards capillary channels 8. Edge gap 6 is simultaneously sealed via edge channel 9. In order to thereby also facilitate an even distribution of the casting resin, additional feed channels 7' are also provided in the base areas without connecting pins. The edge channel also has a base incline 10 which lets the casting resin flow towards edge gap 6.

Figure 3:
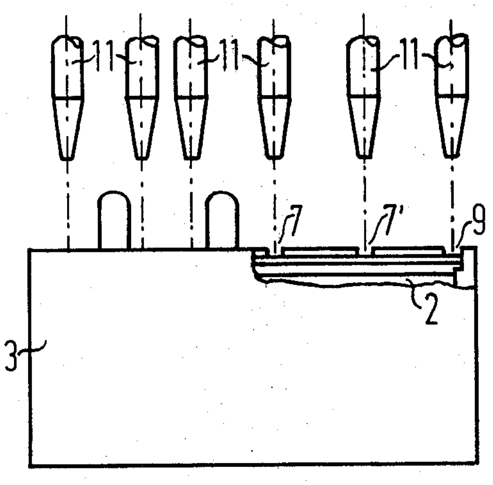
FIG. 3 shows an arrangement for sealing the component of FIG. 1.

FIG. 3 shows the casting resin feed. The component is placed such that the base plate with the connecting pins points upwardly. Then the component is moved in a longitudinal direction under the dosing head of a casting resin dosing unit so that each feed channel 7 or 7' is moved alongside underneath a feed jet 11. Accordingly, casting resin is continuously fed into the feed channels from jets 11.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An electrical component housing, comprising: a base plate having connecting pin apertures, said apertures being adapted to be sealed with casting resin; a channel system means on an exterior surface of the base plate for distributing at least partially by capillary flow a thin layer of the casting resin to the apertures so as to seal them without significantly increasing overall height of the component and to control the resin flow, and a viscosity of the resin being chosen so as not to penetrate through the apertures to an interior of the component; and said channel system means comprising narrow capillary channels connecting the pin apertures to relatively wide feed channels which are open to receive resin poured onto the feed channels from above the base plate with the component in an inverted position.

2. A component housing according to claim 1 wherein a base of the feed channels is inclined towards the capillary channels.

3. A component housing according to claim 1 wherein the feed channels are connected to an edge channel which is positioned alongside an edge gap between the base plate and a housing cover receiving the base plate.

4. A component housing according to claim 3 wherein additional feed channels not connecting to connecting pin apertures lead from the edge channel.

5. A component housing according to claim 1 wherein at least some of the feed channels have a wedge-shaped cross section.

6. An electrical component housing comprising: a housing cover; a base plate received at an open end of the housing cover; said base plate having connecting pin apertures therein; and the base plate having channel means for conveying flowable casting resin from resin dispensing means to and around the connecting pin apertures for sealing hereof, a viscosity of the resin being chosen so as not to penetrate through the apertures to an interior of the component housing, and said channel means comprising wide and open feed channel means for receiving poured resin from the dispensing means and relatively narrower connecting capillary channel means for conveying the resin by capillary flow from the feed channel means to the apertures so as to seal the apertures without significantly increasing overall height of the component housing and to control and limit the resin flow so as not to penetrate through the apertures to an interior of the component housing.

* * * * *